United States Patent
Oh et al.

(10) Patent No.: US 9,613,755 B2
(45) Date of Patent: Apr. 4, 2017

(54) MULTI LAYER CERAMIC CAPACITOR, EMBEDDED BOARD USING MULTI LAYER CERAMIC CAPACITOR AND MANUFACTURING METHOD THEREOF

(71) Applicant: SAMHWA CAPACITOR CO., LTD., Yongin-si (KR)

(72) Inventors: Young Joo Oh, Seoul (KR); Jung Rag Yoon, Yongin-si (KR); Jae Sung Han, Osan-si (KR)

(73) Assignee: SAMHWA CAPACITOR CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/972,644

(22) Filed: Dec. 17, 2015

(65) Prior Publication Data

US 2016/0196921 A1 Jul. 7, 2016

(30) Foreign Application Priority Data

Jan. 2, 2015 (KR) .................... 10-2015-0000212

(51) Int. Cl.
| | |
|---|---|
| *H01G 4/30* | (2006.01) |
| *H01G 4/008* | (2006.01) |
| *H01G 4/06* | (2006.01) |
| *H01G 13/00* | (2013.01) |
| *H05K 1/18* | (2006.01) |
| *H05K 3/34* | (2006.01) |

(52) U.S. Cl.
CPC ............. *H01G 4/30* (2013.01); *H01G 4/008* (2013.01); *H01G 4/06* (2013.01); *H01G 13/006* (2013.01); *H05K 1/185* (2013.01); *H05K 3/3442* (2013.01); *H05K 2201/10015* (2013.01); *Y02P 70/613* (2015.11)

(58) Field of Classification Search
USPC ........................................................ 361/300
See application file for complete search history.

(56) References Cited

U.S. PATENT DOCUMENTS 3,665,267 A * 5/1972 Acello .................... H01G 2/065
361/309
4,831,494 A * 5/1989 Arnold ..................... H01G 4/30
361/306.3

(Continued)

FOREIGN PATENT DOCUMENTS

KR 101245347 3/2013

*Primary Examiner* — Michael F McAllister
(74) *Attorney, Agent, or Firm* — Cantor Colburn LLP

(57) ABSTRACT

A multilayer ceramic capacitor includes a multilayer ceramic sintering body and one or two or more internal electrode units formed to be placed inside the multilayer ceramic sintering body. Each internal electrode unit includes first internal electrodes formed in the multilayer ceramic sintering body in such a way to be spaced apart from each other, one or more of both ends of one side of each of the first internal electrodes being formed to be exposed to the top or bottom surface of the multilayer ceramic sintering body, and second internal electrodes placed between the first internal electrodes, respectively, and formed in the multilayer ceramic sintering body in such a way to be spaced apart from each other, one or more of both ends of the other side of each of the second internal electrodes being formed to be exposed to the top or bottom surface of the sintering body.

7 Claims, 10 Drawing Sheets

(56) References Cited

U.S. PATENT DOCUMENTS

| | | | | |
|---|---|---|---|---|
| 4,831,495 A | * | 5/1989 | Harding | H01L 21/50 |
| | | | | 174/560 |
| 6,292,351 B1 | * | 9/2001 | Ahiko | H01G 4/232 |
| | | | | 361/306.3 |
| 7,068,490 B2 | * | 6/2006 | Prymak | H01G 2/065 |
| | | | | 257/E23.079 |
| 7,152,291 B2 | * | 12/2006 | Ritter | H01C 1/14 |
| | | | | 29/25.03 |
| 7,961,453 B2 | * | 6/2011 | Lee | H01G 4/012 |
| | | | | 361/303 |
| 8,045,319 B2 | * | 10/2011 | Ritter | H01G 2/06 |
| | | | | 361/303 |
| 8,760,842 B2 | | 6/2014 | Oh et al. | |
| 2008/0123247 A1 | * | 5/2008 | Randall | H01G 4/232 |
| | | | | 361/306.2 |
| 2012/0081870 A1 | * | 4/2012 | Randall | H01L 23/50 |
| | | | | 361/782 |

\* cited by examiner

MULTI LAYER CERAMIC CAPACITOR, EMBEDDED BOARD USING MULTI LAYER CERAMIC CAPACITOR AND MANUFACTURING METHOD THEREOF

CROSS REFERENCE TO RELATED APPLICATION

This application claims the benefit of Korean Patent Application No. 10-2015-0000212, filed on Jan. 2, 2015, in the Korean Intellectual Property Office, the disclosure of which is incorporated herein by reference.

BACKGROUND OF THE INVENTION

1. Technical Field

The present invention relates to a multilayer ceramic capacitor, an embedded board using the multilayer ceramic capacitor, and a method of manufacturing the same and, more particularly, to a multilayer ceramic capacitor in which a plurality of internal electrodes is formed to be exposed to the top or bottom surface of a multilayer ceramic sintering body and is electrically connected when the multilayer ceramic capacitor is mounted on a printed circuit board, an embedded board using the multilayer ceramic capacitor, and a method of manufacturing the same.

2. Description of the Related Art

A multilayer ceramic capacitor is mounted on a printed circuit board using a surface mounting method or is provided in the state in which it has been previously mounted inside an embedded printed circuit board. Such a multilayer ceramic capacitor includes a ceramic sintering body and external electrodes. The ceramic sintering body is formed by alternately stacking a plurality of internal electrode layers. The external electrodes are formed at both ends of the ceramic sintering body, and include a plurality of conductive layers.

Korean Patent No. 1245347 issued on Mar. 13, 2013 relates to a multilayer ceramic capacitor. The multilayer ceramic capacitor includes a multilayer ceramic sintering body and a plurality of external electrodes.

A plurality of internal electrode layers is formed in the multilayer ceramic sintering body in such a way as to cross each other. The plurality of external electrodes is formed to surround one side or the other side of the multilayer ceramic sintering body and is connected to the internal electrode layers. The plurality of external electrodes includes a plurality of conductive layers. The plurality of conductive layers includes a first conductive layer, a second conductive layer, a third conductive layer, and a fourth conductive layer. The first conductive layer is formed to surround the circumferential surface of the multilayer ceramic sintering body on one side or the other side thereof and the cross section of the multilayer ceramic sintering body and is connected to the internal electrode layers. The second conductive layer is stacked on the first conductive layer and formed to surround the first conductive layer. The third conductive layer is stacked on the second conductive layer and formed to surround the second conductive layer. The fourth conductive layer is stacked on the third conductive layer and formed to surround the third conductive layer.

In the conventional multilayer ceramic capacitor, such as Korean Patent No. 1245347, the external electrodes are formed to surround the ends of the multilayer ceramic sintering body on one side or the other side thereof in order to be connected to the internal electrode layers. If the external electrodes are formed to surround the ends of the multilayer ceramic sintering body as in the conventional multilayer ceramic capacitor, when the multilayer ceramic capacitor is mounted on the printed circuit board using a solder, the solder takes the external electrodes up and adheres thereto and the space for electrical insulation from other electronic parts is required. Accordingly, there is a problem in that part mounting density is reduced.

SUMMARY OF THE INVENTION

Accordingly, the present invention has been made keeping in mind the above problems occurring in the prior art, and an object of the present invention is to provide a multilayer ceramic capacitor in which a plurality of internal electrodes is formed to be exposed to the top or bottom surface of a multilayer ceramic sintering body and is electrically connected when the multilayer ceramic capacitor is mounted on a printed circuit board, an embedded board using the multilayer ceramic capacitor, and a method of manufacturing the same.

Another object of the present invention is to provide a multilayer ceramic capacitor in which internal electrodes formed to be exposed to the top or bottom surface of a multilayer ceramic sintering body have different areas so that a multilayer ceramic capacitor having varying capacitance is mounted on a printed circuit board, an embedded board using the multilayer ceramic capacitor, and a method of manufacturing the same.

Yet another object of the present invention is to provide a multilayer ceramic capacitor in which an external electrode is formed in an internal electrode exposed to the top or bottom surface of a multilayer ceramic sintering body in order to improve an adhesive force between the multilayer ceramic capacitor and a printed circuit board when the multilayer ceramic capacitor is mounted on the printed circuit board, a multilayer ceramic capacitor, an embedded board using the multilayer ceramic capacitor, and a method of manufacturing the same.

Further yet another object of the present invention is to provide a multilayer ceramic capacitor in which internal electrodes are formed to be exposed to the top or bottom surface of a multilayer ceramic sintering body so that an embedded board having the multilayer ceramic capacitor embedded therein can be easily manufactured, an embedded board using the multilayer ceramic capacitor, and a method of manufacturing the same.

A multilayer ceramic capacitor according to an embodiment of the present invention provides includes a multilayer ceramic sintering body and one or two or more internal electrode units formed to be placed inside the multilayer ceramic sintering body. Each of the one or two or more internal electrode units includes a plurality of first internal electrodes formed in the multilayer ceramic sintering body in such a way as to be spaced apart from each other, one or more of both ends of one side of each of the plurality of first internal electrodes being formed to be exposed to the top or bottom surface of the multilayer ceramic sintering body, and a plurality of second internal electrodes placed between the plurality of first internal electrodes, respectively, and formed in the multilayer ceramic sintering body in such a way as to be spaced apart from each other, one or more of both ends of the other side of each of the plurality of second internal electrodes being formed to be exposed to the top or bottom surface of the multilayer ceramic sintering body.

An embedded board using a multilayer ceramic capacitor according to an embodiment of the present invention includes a first insulating substrate; a second insulating substrate formed over the first insulating substrate; one or more multilayer ceramic capacitors disposed with a middle insulating substrate interposed between the first insulating substrate and the second insulating substrate; one or more first conductive connection pads inserted into the first insulating substrate or the second insulating substrate and connected to one side of the top or bottom surface of the multilayer ceramic capacitor; and one or more second conductive connection pads inserted into the first insulating substrate or the second insulating substrate and connected to the other side of the top or bottom surface of the multilayer ceramic capacitor. One or more first laser processing holes into which the first conductive connection pad is inserted and one or more second laser processing holes into which the second conductive connection pad is inserted are formed in each of the first insulating substrate and the second insulating substrate.

A method of manufacturing a multilayer ceramic capacitor according to an embodiment of the present invention includes preparing a plurality of green sheets; forming a plurality of first internal electrodes or a plurality of second internal electrodes in a top surface of the plurality of green sheets; forming a compression body by sequentially stacking and compressing the plurality of green sheets in which the plurality of first internal electrodes or the plurality of second internal electrodes is formed in a vertical direction so that the first internal electrodes and the second internal electrodes become symmetrical to each other; forming green chips by cutting the compression body so that cross sections of the plurality of first internal electrodes or the plurality of second internal electrodes are externally exposed; forming a multilayer ceramic sintering body by sintering the green chip; polishing a surface of the multilayer ceramic sintering body after the multilayer ceramic sintering body is formed; and forming first external electrodes or second external electrodes by coating a metal material on one side and second side of the top or bottom surface of the multilayer ceramic sintering body after the multilayer ceramic sintering body is polished. Forming the green chip includes cutting the compression body so that one or more of both ends of one side or second side of each of the plurality of first internal electrodes or the plurality of second internal electrodes are exposed to the top or bottom surface of the green chip.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION

Figure 1:
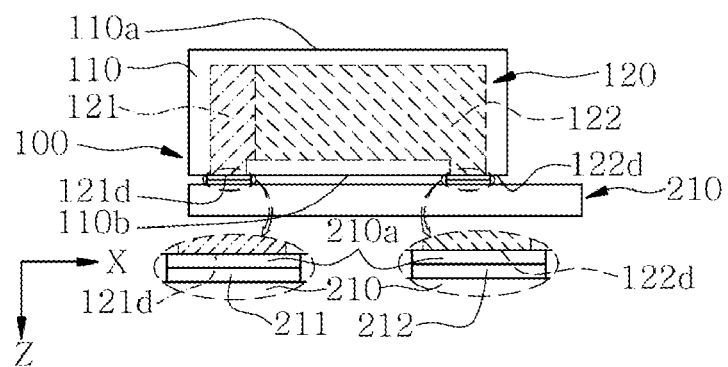
FIG. 1 is a side view of a multilayer ceramic capacitor according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Hereinafter, a multilayer ceramic capacitor, an embedded board using the multilayer ceramic capacitor, and a method of manufacturing the same according to embodiments of the present invention are described with reference to the accompanying drawings.

Figure 2:
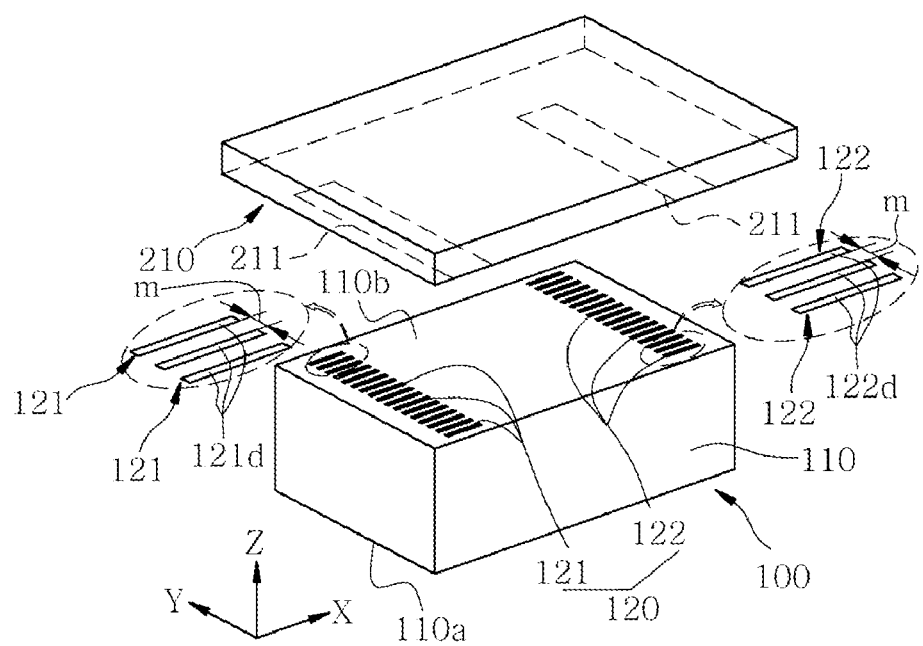
FIG. 2 is a perspective view showing the state in which a printed circuit board and the multilayer ceramic capacitor shown in FIG. 1 have been separated.
Figure 3:
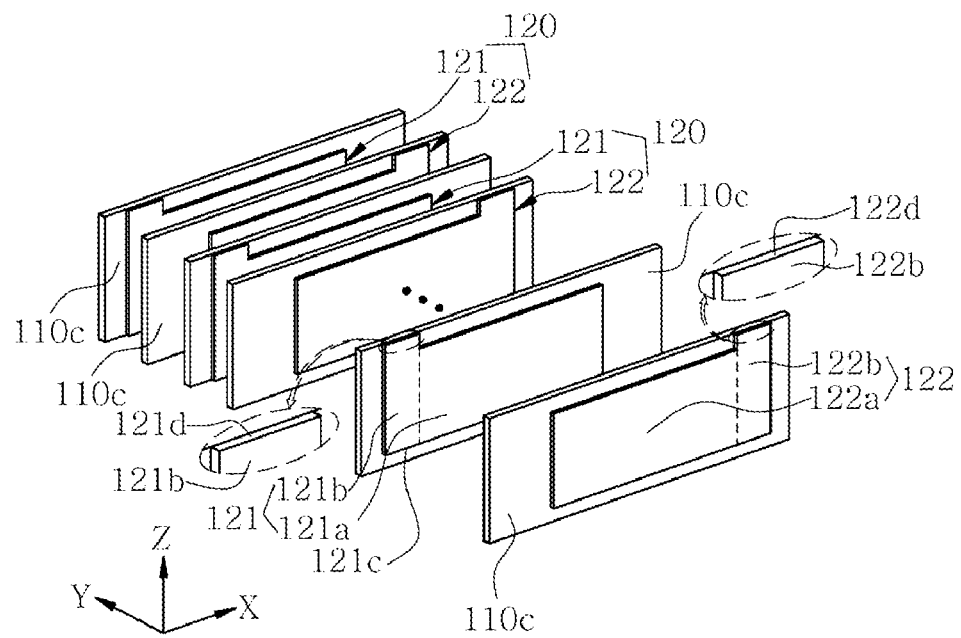
FIG. 3 is an exploded perspective view of the multilayer ceramic capacitor shown in FIG. 2.

As shown in FIGS. 1 to 3, a multilayer ceramic capacitor 100 according to an embodiment of the present invention includes a multilayer ceramic sintering body 110 and a single internal electrode unit 120.

The multilayer ceramic sintering body 110 is made of a known dielectric material. The since internal electrode unit 120 is formed to be placed inside the multilayer ceramic sintering body 110. The single internal electrode unit 120 includes a plurality of first internal electrodes 121 and a plurality of second internal electrodes 122. The plurality of first internal electrodes 121 is formed in the multilayer ceramic sintering body 110 in such a way as to be spaced apart from each other in a vertical direction Z. One of both ends of one side of each of the plurality of first internal electrodes 121 is formed to be exposed to the bottom surface 110b of the multilayer ceramic sintering body 110. The plurality of second internal electrodes 122 is formed in the multilayer ceramic sintering body 110 in the vertical direction Z and is respectively placed between the plurality of first internal electrodes 121 in such a way as to be spaced apart from each other. One end 121d, 122d of both ends 121c, 121d, 122c, 122d of the other side of each of the plurality of second internal electrodes 122 is formed to be exposed to the bottom surface 110b of the multilayer ceramic sintering body 110. For example, one end 121d of both ends 121c, 121d of each of the plurality of first internal electrodes 121 is formed to be exposed to the outside. One end 122d of both ends 122c, 122d of each of the plurality of second internal electrodes 122 is formed to be exposed to the outside. Accordingly, the one ends 121d, 122d are connected to the soldering pads 211, 212 of the printed circuit board 210 by a soldering 210a, thus being electrically connected.

Figure 4:
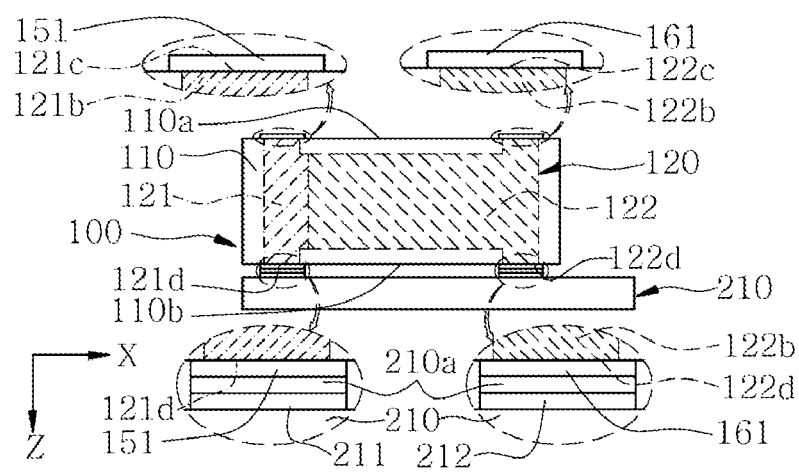
FIG. 4 is a side view of a multilayer ceramic capacitor according to another embodiment of the present invention.
Figure 5:
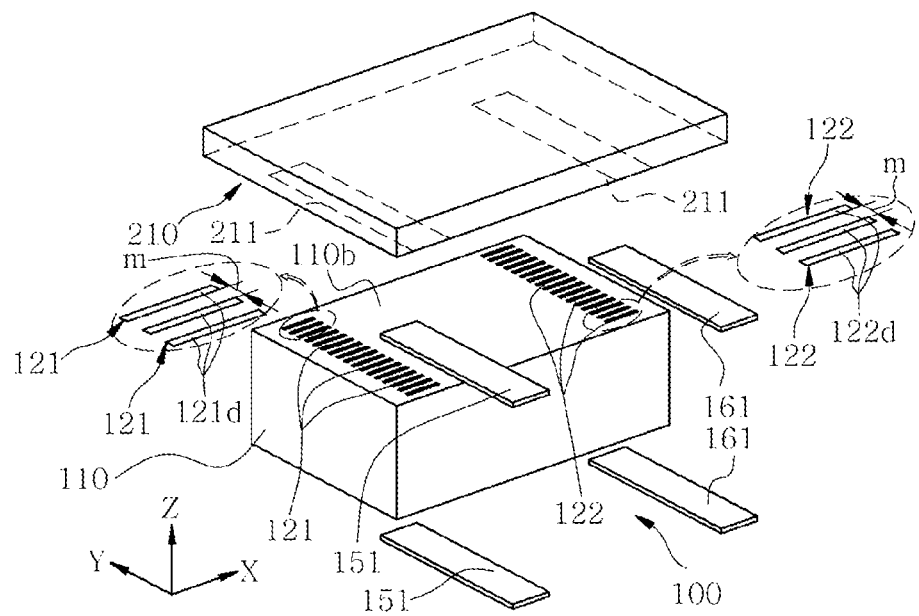
FIG. 5 is a perspective view of the multilayer ceramic capacitor shown in FIG. 1.
Figure 6:
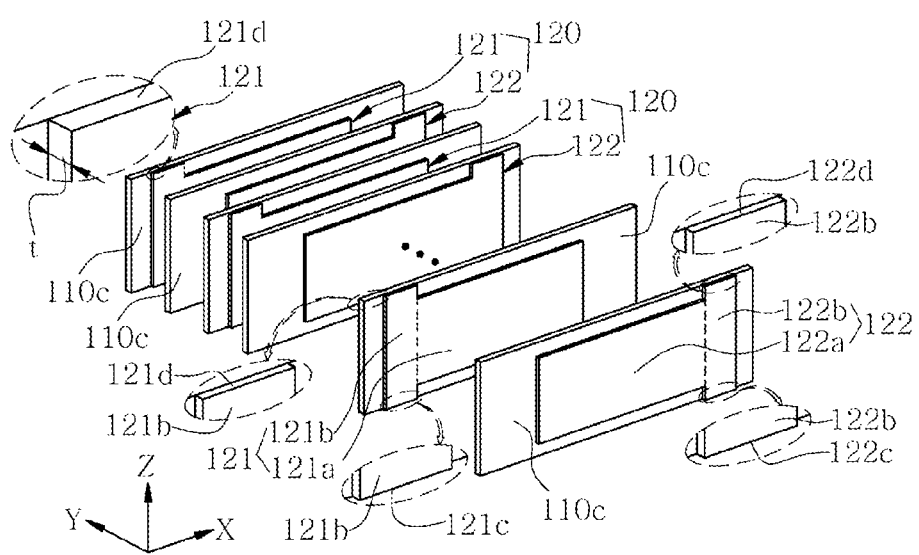
FIG. 6 is an exploded perspective view of the multilayer ceramic capacitor shown in FIG. 5.

As shown in FIGS. 4 to 6, a multilayer ceramic capacitor 100 according to another embodiment of the present invention includes a multilayer ceramic sintering body 110 and a single internal electrode unit 120.

The multilayer ceramic sintering body 110 is made of a known dielectric material. The single internal electrode unit 120 is formed in the multilayer ceramic sintering body 110 in such a way as to be spaced apart from each other. The internal electrode unit 120 includes a plurality of first internal electrodes 121 and a plurality of second internal electrodes 122. One or more 121c, 121d of both ends 121c, 121d of on one side of each of the plurality of first internal electrodes 121 are formed to be exposed to the top surface 110a or bottom surface 110b of the multilayer ceramic sintering body 110. The plurality of second internal electrodes 122 is formed in the multilayer ceramic sintering body 110 in such a way as to be spaced apart from each other and is respectively placed between the plurality of first internal electrodes 121. One or more 122c, 122d of both ends 122c, 122d of the other side of each of the plurality of second internal electrodes 122 are formed to be exposed to the top surface 110a or bottom surface 110b of the multilayer ceramic sintering body 110. For example, both ends 121c, 121d of one side of each of the plurality of first internal electrodes 121 are formed to be externally exposed to the top surface 110a or bottom surface 110b of the multilayer ceramic sintering body 110. Both ends 122c, 122d of one side of each of the plurality of second internal electrodes 122 are formed to be externally exposed to the top surface 110a or bottom surface 110b of the multilayer ceramic sintering body 110. Accordingly, both ends 121c, 121d and both ends 122c, 122d are connected to the soldering pads 211, 212 of the printed circuit board 210 by a soldering 210a, thereby being electrically connected.

As shown in FIGS. 7 to 11, a multilayer ceramic capacitor 100 according to yet another embodiment of the present invention includes a multilayer ceramic sintering body 110 and two or more internal electrode units 120, 130, 140.

The multilayer ceramic sintering body 110 is made of a known dielectric material. The two or more internal electrode units 120, 130, 140 are formed in the multilayer ceramic sintering body 110 in a vertical direction Z and spaced apart from each other. The two or more internal electrode units 120, 130, 140 include a plurality of first internal electrodes 121, 131, 141 and a plurality of second internal electrodes 122, 132, 142, respectively. In the plurality of first internal electrodes 121, 131, 141 respectively included in the two or more internal electrode units 120, 130, 140, one or more 121c, 131c, 141c, 121d, 131d, 141d of both ends 121c, 131c, 141c, 121d, 131d, 141d on one side are formed to be exposed to the top surface 110a or bottom surface 110b of the multilayer ceramic sintering body 110. The plurality of second internal electrodes 122, 132, 142 respectively included in the two or more internal electrode units 120, 130, 140 is formed in the multilayer ceramic sintering body 110 in such a way as to be spaced apart from each other and is respectively placed between the plurality of first internal electrodes 121, 131, 141. One or more 122c, 132c, 142c, 122d, 132d, 142d of both ends 122c, 132c, 142c, 122d, 132d, 142d of the plurality of second internal electrodes on the other side are formed to be exposed to the top surface 110a or bottom surface 110b of the multilayer ceramic sintering body 110.

For example, one or more 121c, 131c, 141c, 121d, 131d, 141d of both ends 121c, 131c, 141c, 121d, 131d, 141d of the plurality of first internal electrodes 121, 131, 141 on one side are formed to be exposed to the outside. One or more 122c, 132c, 142c, 122d, 132d, 142d of both ends 122c, 132c, 142c, 122d, 132d, 142d of the plurality of second internal electrodes 122, 132, 142 on the other side are formed to be exposed to the outside. Accordingly, the one or more ends 121c, 131c, 141c, 121d, 131d, 141d and the one or more ends 122c, 132c, 142c, 122d, 132d, 142d are connected to the soldering pads 211, 212, 213, 214, 215, 216 of the printed circuit board 210 by a soldering 210a, thus being electrically connected.

More specifically, the internal electrode unit 120 of the two or more internal electrode units 120, 130, 140 includes the plurality of first internal electrodes 121 and the plurality of second internal electrodes 122. The plurality of first internal electrodes 121 and the plurality of second internal electrodes 122 are respectively connected to the soldering pads 211, 212 of the printed circuit board 210 by the soldering 210a, thus being electrically connected. The internal electrode unit 130 includes the plurality of first internal electrodes 131 and the plurality of second internal electrodes 132. The plurality of first internal electrodes 131 and the plurality of second internal electrodes 132 are respectively connected to the soldering pads 213 and 214 of the printed circuit board 210 by the soldering 210a, thus being electrically connected. The internal electrode unit 140 includes the plurality of first internal electrodes 141 and the plurality of second internal electrodes 142. The plurality of first internal electrodes 141 and the plurality of second internal electrodes 142 are respectively connected to the soldering pads 215 and 216 of the printed circuit board 210 by the soldering 210a, thus being electrically connected.

Figure 12:
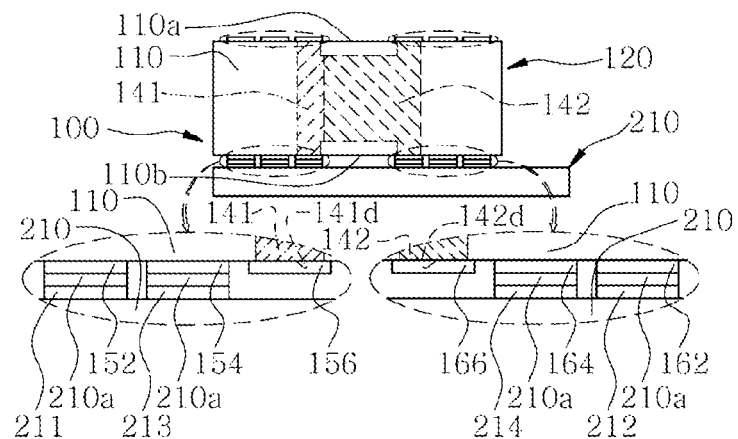
FIGS. 12 and 13 are side views showing a method of using the multilayer ceramic capacitor shown in FIG. 7.
Figure 13:
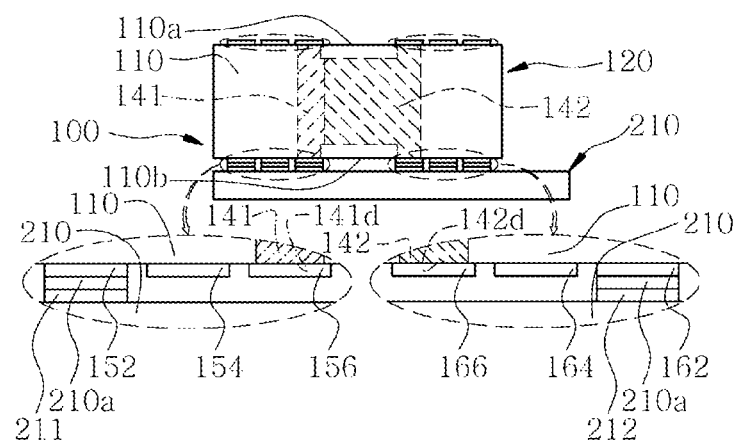

All of the two or more internal electrode units 120, 130, 140 may be connected to the soldering pads 211, 212, 213, 214, 215, 216 of the printed circuit board 210 as described above, only the two internal electrode units 120 and 130 may be connected to the soldering pad 211, 212, 213, 214 of the printed circuit board 210 as shown in FIG. 12, or only the single internal electrode unit 120 may be connected to the soldering pads 211, 212 of the printed circuit board 210 as shown in FIG. 13. Accordingly, the multilayer ceramic capacitor 100 according to an embodiment of the present invention may be mounted on the printed circuit board 210 in such a manner that capacitance is varied at a step interval.

The configuration of the multilayer ceramic capacitor 100 according to an embodiment of the present invention is described in more detail below.

Figure 7:
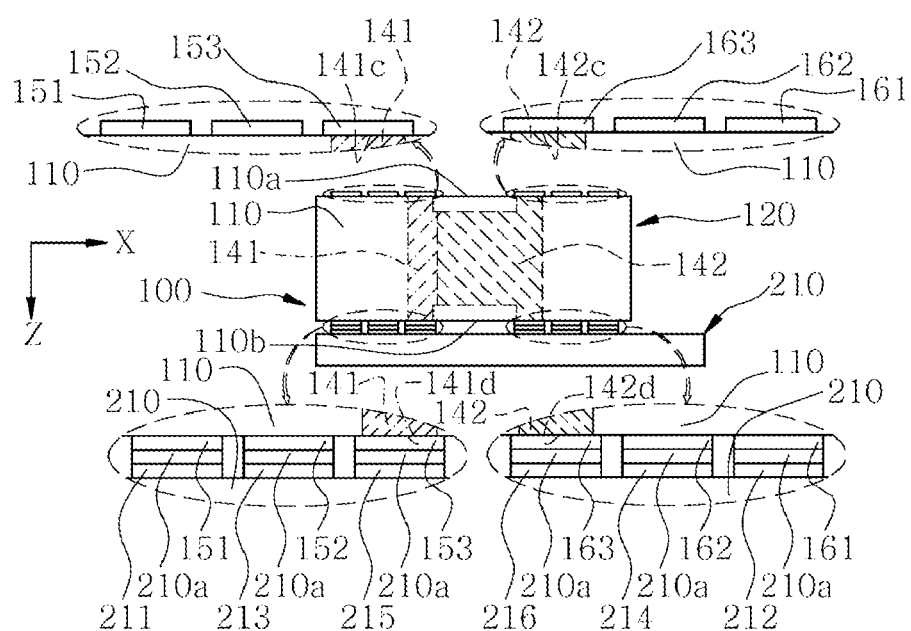
FIG. 7 is a side view of a multilayer ceramic capacitor according to yet another embodiment of the present invention.

The multilayer ceramic sintering body 110 is made of a known dielectric material. As shown in FIGS. 1, 4, and 7, the bottom surface 110b of the multilayer ceramic sintering body 110 is a surface that is placed on one side of the multilayer ceramic sintering body 110 and that faces the printed circuit board 210 when the multilayer ceramic capacitor 100 is mounted on the printed circuit board 210. The top surface 110a of the multilayer ceramic sintering body 110 is a surface that is placed on the other side of the multilayer ceramic sintering body 110 and that is spaced apart from the bottom surface 110b in the vertical direction Z.

Figure 8:
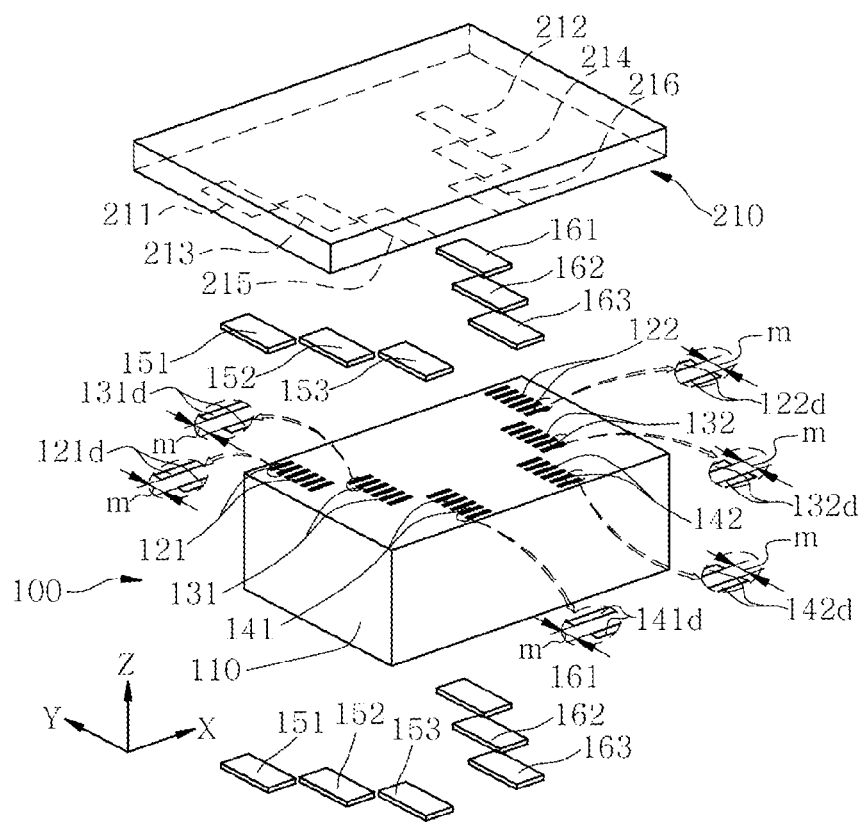
FIG. 8 is a perspective view of the multilayer ceramic capacitor shown in FIG. 7.
Figure 9:
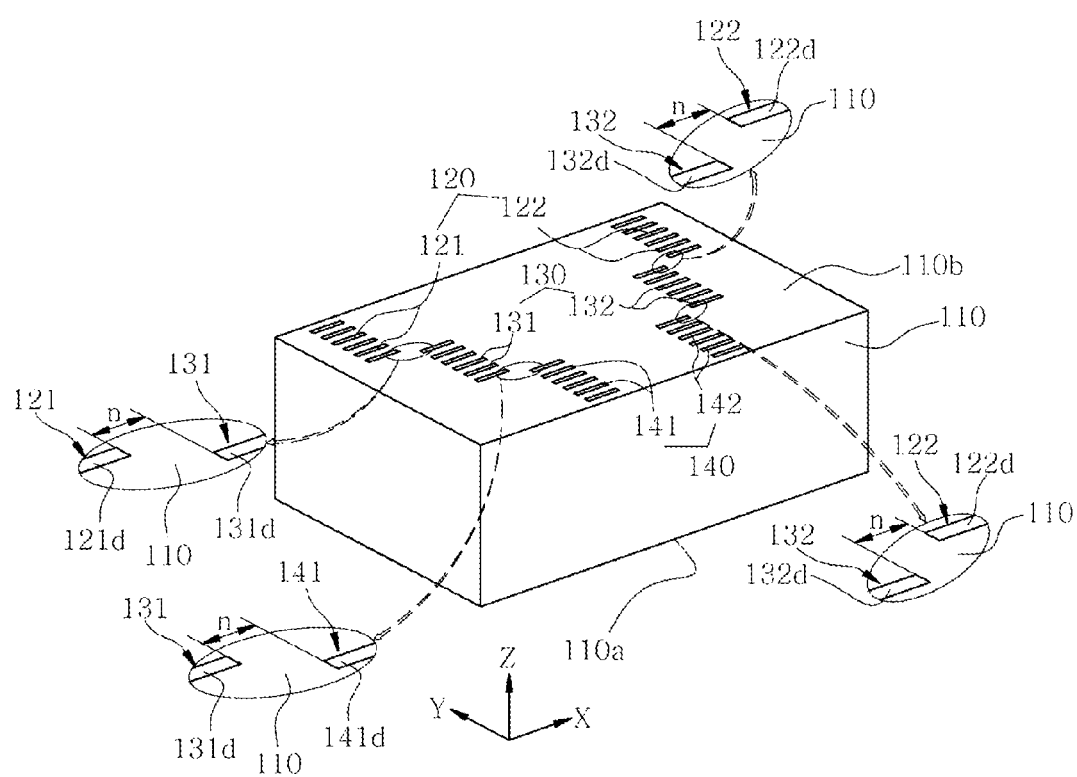
FIG. 9 is an enlarged perspective view of a multilayer ceramic sintering body shown in FIG. 8.
Figure 11:
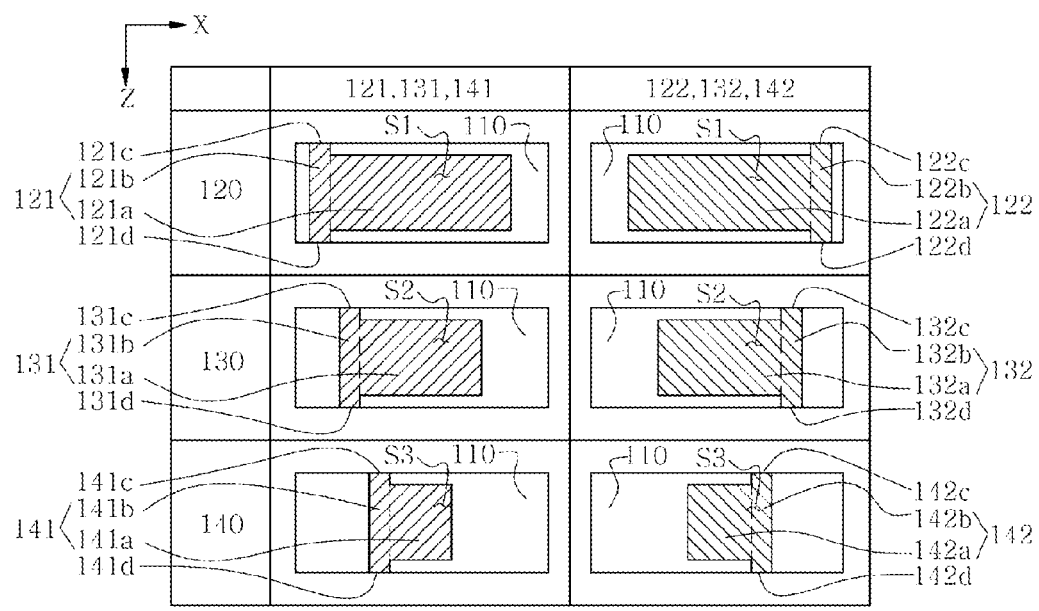
FIG. 11 is a table showing first and second internal electrodes included in each of two or more internal electrode units shown in FIG. 10.

An interval "m" between the plurality of first internal electrodes 121, 131, 141 and between the plurality of second internal electrodes 122, 132, 142 included in the two or more internal electrode units 120, 130, 140, respectively, is 0.3 to 5 μm as shown in FIGS. 2, 5, and 8. The plurality of first internal electrodes and the plurality of second internal electrodes are stacked on the multilayer ceramic sintering body 110. If all of the two or more internal electrode units 120, 130, 140 are included in a single multilayer ceramic capacitor 100, they include the plurality of first internal electrodes 121, 131, 141 and the plurality of second internal electrodes 122, 132, 142 having different areas S1, S2, S3 as shown in FIG. 11. Accordingly, the two or more internal electrode units 120, 130, 140 are formed to be spaced apart from each other at an interval "n" of 10 μm or more as shown in FIG. 9.

For example, if the two or more internal electrode units 120, 130, 140 are applied as in FIGS. 7 to 10, the multilayer ceramic capacitor 100 includes the first internal electrode unit 120, the second internal electrode unit 130, and the third internal electrode unit 140. The first internal electrode unit 120, the second internal electrode unit 130, and the third internal electrode unit 140 are formed in the multilayer ceramic sintering body 110 in such a way as to be spaced apart from each other in the vertical direction, that is, in the Z-axis direction Z, so that the ends 121c, 121d, 122c, 122d, 131c, 131d, 132c, 132d, 141c, 141d, 142c, 142d of one side or the other side of the first to third internal electrode units 120, 130, 140 are spaced apart from each other in the horizontal direction, that is, in the X-axis direction X. In this case, the interval "n" between the first to third internal electrode units in the X-axis direction X is 10 μm or more.

The first internal electrode unit 120 includes the plurality of first internal electrodes 121 and the plurality of second internal electrodes 122. As shown in FIG. 11, each of the plurality of first internal electrodes 121 has a first area S1, and the plurality of first internal electrodes 121 is formed in the multilayer ceramic sintering body 110 in such a way as to be spaced apart from each other. One or more 121c, 121d of both ends 121c, 121d of one side of each of the plurality of first internal electrodes 121 are formed to be exposed to the top surface 110a or bottom surface 110b of the multilayer ceramic sintering body 110. The plurality of second internal electrodes 122 is respectively placed between the plurality of first internal electrodes 121, and each has the same first area S1 as the first internal electrode 121. The plurality of second internal electrodes 122 is formed in the multilayer ceramic sintering body 110 in such a way as to be spaced apart from each other. One or more 122c, 122d of both ends 122c, 122d of the other side of each of the plurality of second internal electrodes 122 are formed to be exposed to the top surface 110a or bottom surface 110b of the multilayer ceramic sintering body 110.

The second internal electrode unit 130 includes the plurality of first internal electrodes 131 and the plurality of second internal electrodes 132. As shown in FIG. 11, each of the plurality of first internal electrodes 131 has a second area S2 smaller than the first area S1 of the first internal electrode 121 or second internal electrode 122. The plurality of first internal electrodes 131 is formed in the multilayer ceramic sintering body 110 in such a way as to be spaced apart from each other. One or more 131c, 131d of both ends 131c, 131d of one side of each of the plurality of first internal electrodes 131 are formed to be exposed to the top surface 110a or bottom surface 110b of the multilayer ceramic sintering body 110. The plurality of second internal electrodes 132 is respectively placed between the plurality of first internal electrodes 131, and each has the same second area S2 as the first internal electrode 131. The plurality of second internal electrodes 132 is formed in the multilayer ceramic sintering body 110 in such a way as to be spaced apart from each other. One or more 132c, 132d of both ends 132c, 132d of the other side of each of the plurality of second internal electrodes 132 are formed to be exposed to the top surface 110a or bottom surface 110b of the multilayer ceramic sintering body 110.

The third internal electrode unit 140 includes the plurality of first internal electrodes 141 and the plurality of second internal electrodes 142. As shown in FIG. 11, the plurality of first internal electrodes 141 is formed in the multilayer ceramic sintering body 110 in such a way as to be spaced apart from each other, and each has a third area S3 smaller than the second area S2 of the first internal electrode 131 or second internal electrode 132. One or more 141c, 141d of both ends 141c, 141d of one side of each of the plurality of first internal electrodes 141 are formed to be exposed to the top surface 110a or bottom surface 110b of the multilayer ceramic sintering body 110. The plurality of second internal electrodes 142 is respectively placed between the plurality of first internal electrodes 141, and each has the same third area S3 as the first internal electrode 141. The plurality of second internal electrodes 142 is formed in the multilayer ceramic sintering body 110 in such a way as to be spaced apart from each other. One or more 142c, 142d of both ends 142c, 142d of the other side of each of the plurality of second internal electrodes 142 are formed to be exposed to the top surface 110a or bottom surface 110b of the multilayer ceramic sintering body 110.

Figure 10:
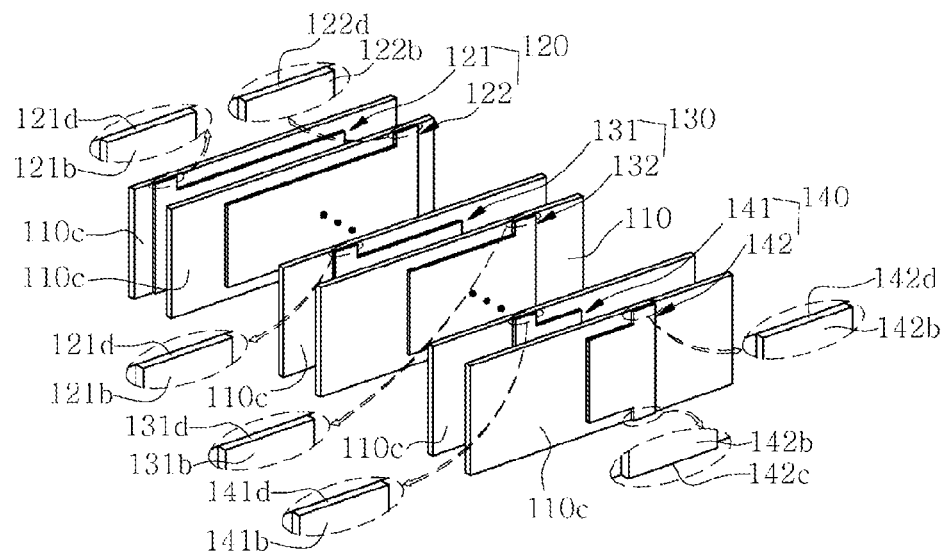
FIG. 10 is an exploded perspective view of the multilayer ceramic capacitor shown in FIG. 8.

The first area S1, the second area S2, and the third area S3 are indicative of the areas of the first internal electrodes 121, 131, 141 and the second internal electrodes 122, 133, 142, respectively, which are indicated by deviant crease line areas of FIG. 10. Since the first internal electrodes 121, 131, 141 and the second internal electrodes 122, 133, 142 are formed to have the different first area S1, second area S2, and third area S3 as described above, each of the multilayer ceramic capacitors 100 shown in FIGS. 7 to 11 can be mounted on the printed circuit board 210 with capacitance varied at a step interval through the solderings 210a as in FIGS. 7, 12, and 13.

More detailed embodiments of the first internal electrode unit 120, the second internal electrode unit 130, and the third internal electrode unit 140 are described below with reference to FIGS. 7 to 10.

The first internal electrode unit 120 includes the plurality of first internal electrodes 121 and the plurality of second internal electrodes 122. The second internal electrode unit 130 includes the plurality of third internal electrodes 131 and the plurality of fourth internal electrodes 132. The third internal electrode unit 140 includes the plurality of fifth internal electrodes 141 and the plurality of sixth internal electrodes 142.

The plurality of first internal electrodes 121 of the first internal electrode unit 120 is formed in the multilayer ceramic sintering body 110 in such a way as to be spaced apart from each other so that each of the first internal electrodes has the first area S1 as shown in FIG. 11. One or more 121c, 121d of both ends 121c, 121d of one side of each of the plurality of first internal electrodes 121 are formed to be exposed to the top surface 110a or bottom surface 110b of the multilayer ceramic sintering body 110. The plurality of second internal electrodes 122 of the first internal electrode unit 120 is respectively placed between the plurality of first internal electrodes 121 and is formed in the multilayer ceramic sintering body 110 in such a way as to be spaced apart from each other so that each of the second internal electrodes 122 has the same first area S1 as the first internal electrode 121. One or more 122c, 122d of both ends 122c, 122d of the other side of each of the plurality of second internal electrodes 122 are formed to be exposed to the top surface 110a or bottom surface 110b of the multilayer ceramic sintering body 110.

The plurality of third internal electrodes 131 of the second internal electrode unit 130 is formed in the multilayer ceramic sintering body 110 in such a way as to be spaced apart from each other so that each of the third internal electrodes has the second area S2 smaller than the first area S1 of the first internal electrodes 121 or second internal electrodes 122 as shown in FIG. 11. One or more 131c, 131d of both ends 131c, 131d of one side of each of the plurality of third internal electrodes 131 are formed to be exposed to the top surface 110a or bottom surface 110b of the multilayer ceramic sintering body 110. The plurality of fourth internal electrodes 132 of the second internal electrode unit 130 is respectively placed between the plurality of third internal electrodes 131 and is formed in the multilayer ceramic sintering body 110 in such a way as to be spaced apart from each other so that each of the fourth internal electrodes has the same second area S2 as the fourth internal electrodes 132. One or more 132c, 132d of both ends 132c, 132d of the other side of each of the plurality of fourth internal electrodes 132 are formed to be exposed to the top surface 110a or bottom surface 110b of the multilayer ceramic sintering body 110.

The plurality of fifth internal electrodes 141 of the third internal electrode unit 140 is formed in the multilayer ceramic sintering body 110 in such a way as to be spaced apart from each other so that each of the fifth internal electrodes has the third area S3 smaller than the second area S2 of the third internal electrodes 131 or fourth internal electrodes 132 as shown in FIG. 11. One or more 141c, 141d of both ends 141c, 141d of one side of each of the plurality of fifth internal electrodes 141 are formed to be exposed to the top surface 110a or bottom surface 110b of the multilayer ceramic sintering body 110. The plurality of sixth internal electrodes 142 of the third internal electrode unit 140 is respectively placed between the plurality of fifth internal electrodes 141 and is formed in the multilayer ceramic sintering body 110 in such a way as to be spaced apart from each other so that each of the sixth internal electrodes has the same third area S3 as the fifth internal electrode 141. One or more 142c, 142d of both ends 142c, 142d of the other side of each of the plurality of sixth internal electrodes 142 are formed to be exposed to the top surface 110a or bottom surface 110b of the multilayer ceramic sintering body 110.

The first area S1, the second area S2, and the third area S3 are indicative of the areas of the first, the third, and the fifth internal electrodes 121, 131, 141 and the second, the fourth, and the sixth internal electrodes 122, 133, 142, respectively, which are indicated by the deviant crease lines of FIG. 10. Since the first, the third, and the fifth internal electrodes 121, 131, 141 and the second, the fourth, and the sixth internal electrodes 122, 133, 142 are formed to have the different first area S1, second area S2, and third area S3 as described above, each of the multilayer ceramic capacitors 100 of FIGS. 7 to 11 may be mounted on the printed circuit board 210 with capacitance varied at a step interval through the soldering 210a as shown in FIGS. 7, 12, and 13.

The plurality of first internal electrodes 121, 131, 141 and the plurality of second internal electrodes 122, 132, 142 applied to the two or more internal electrode units 120, 130, 140, respectively, include internal electrode pattern layers 121a, 122a, 131a, 132a, 141a, 142a and exposure electrode pattern layers 121a, 122a, 131a, 132a, 141a, 142a.

The internal electrode pattern layers 121a, 122a, 131a, 132a, 141a, 142a are overlapped in the vertical direction, that is, in the Z-axis direction Z, and are formed in the multilayer ceramic sintering body 110 in such a way as to be spaced apart from each other. The exposure electrode pattern layers 121a, 122a, 131a, 132a, 141a, 142a are formed to be integrated with the internal electrode pattern layers 121a, 122a, 131a, 132a, 141a, 142a and connected thereto. One or more of both ends 121c, 121d, 122c, 122d, 131c, 131d, 132c, 132d, 141c, 141d, 142c, 142d of the exposure electrode pattern layers are formed to be exposed to the top surface 110a or bottom surface 110b of the multilayer ceramic sintering body 110. For example, the exposure electrode pattern layers 121a, 122a, 131a, 132a, 141a, 142a are formed in the Z-axis direction Z toward the top surface 110a or bottom surface 110b of the multilayer ceramic sintering body 110, and one ends 121c, 121d, 122c, 122d, 131c, 131d, 132c, 132d, 141c, 141d, 142c, 142d of both ends 121c, 121d, 122c, 122d, 131c, 131d, 132c, 132d, 141c, 141d, 142c, 142d thereof are formed in the top surface 110a or bottom surface 110b of the multilayer ceramic sintering body 110 in such a way as to be externally exposed. Each of the internal electrode pattern layers 121a, 122a, 131a, 132a, 141a, 142a and the exposure electrode pattern layers 121a, 122a, 131a, 132a, 141a, 142a is formed in a sheet using Cu or Ni.

Each of the exposure electrode pattern layers 121a, 122a, 131a, 132a, 141a, 142a is formed to have a smaller width of 30 to 50 μm than each of the internal electrode pattern layers 121a, 122a, 131a, 132a, 141a, 142a. Each of the exposure electrode pattern layers 121a, 122a, 131a, 132a, 141a, 142a is formed to have a higher height than each of the internal electrode pattern layers 121a, 122a, 131a, 132a, 141a, 142a. In this case, each of the internal electrode pattern layers 121a, 122a, 131a, 132a, 141a, 142a and the exposure electrode pattern layers 121a, 122a, 131a, 132a, 141a, 142a is segmented as indicated by a dotted line in FIG. 11, the width thereof is the length in the X-axis direction, and the height thereof is the length in the Y-axis direction.

The plurality of first internal electrodes 121, 131, 141 of the plurality of first internal electrodes 121, 131, 141 and second internal electrodes 122, 132, 142 respectively included in the two or more internal electrode units 120, 130, 140 is connected by first external electrodes 151, 152, 153, and the plurality of second internal electrodes 122, 132, 142 is connected by second external electrodes 161, 162, 163, as shown in FIGS. 4 and 7.

The first external electrodes 151, 152, 153 are formed in the top surface 110a or bottom surface 110b of the multilayer ceramic sintering body 110 and are formed to be electrically connected to the plurality of first internal electrodes 121, 131, 141 so that one or more 121c, 121d, 131c, 131d, 141c, 141d of both ends 121c, 121d, 131c, 131d, 141c, 141d of one side of the plurality of first internal electrodes 121, 131, 141 are formed to be exposed to the top surface 110a or bottom surface 110b of the multilayer ceramic sintering body 110. The second external electrodes 161, 162, 163 are formed in the top surface 110a or bottom surface 110b of the multilayer ceramic sintering body 110 and are formed to be electrically connected to the plurality of second internal electrodes 122, 132, 142 so that one or more 122c, 122d, 132c, 132d, 142c, 142d of both ends 122c, 122d, 132c, 132d, 142c, 142d of the other side of the plurality of second internal electrodes 122, 132, 142 are formed to be exposed to the top surface 110a or bottom surface 110b of the multilayer ceramic sintering body 110.

For example, as shown in FIGS. 4 and 5, if the single internal electrode unit 120 is formed in the multilayer ceramic sintering body 110 and both ends 121c, 121d, 122c, 122d of the plurality of first internal electrodes 121 and second internal electrodes 122 included in the single internal electrode unit 120 are formed to be exposed, the multilayer ceramic sintering body 110 includes the single first external electrode 151 and the single second external electrode 161. The multilayer ceramic sintering body 110 includes a pair of the first external electrodes 151 and a pair of the second external electrodes 161. The pair of first external electrodes 151 and the pair of second external electrodes 161 are formed to be placed in the top surface 110a and bottom surface 110b of the multilayer ceramic sintering body 110 so that the plurality of first internal electrodes 121 and the plurality of second internal electrodes 122 are electrically connected.

As shown in FIGS. 7 and 8, if the two or more internal electrode units 120, 130, 140 are formed in the multilayer ceramic sintering body 110 and both ends 121c, 121d, 122c, 122d, 131c, 131d, 132c, 132d, 141c, 141d, 142c, 142d of the plurality of first internal electrodes 121, 131, 141 and the plurality of second internal electrodes 122, 132, 142 included in the two or more internal electrode units 120, 130, 140, respectively, are formed to be exposed, the multilayer ceramic sintering body 110 includes a plurality of first external electrodes 151, 152, 153 and a plurality of second external electrodes 161, 162, 163. The multilayer ceramic sintering body 110 includes pairs of each of the plurality of first external electrodes 151, 152, 153 and pairs of each of the plurality of second external electrodes 161, 162, 163. The plurality of first external electrodes 151, 152, 153 each forming a pair is formed in both ends 121c, 121d, 131c, 131d, 141c, 141d of the plurality of first internal electrodes 121, 131, 141 so that the plurality of first internal electrodes 121, 131, 141 is electrically connected, respectively. The plurality of second external electrodes 161, 162, 163 each forming a pair is formed in both ends 122c, 122d, 132c, 132d, 142c, 142d of the plurality of second internal electrodes 122, 132, 142 so that the plurality of second internal electrodes 122, 132, 142 is electrically connected, respectively. Each of the first external electrodes 151, 152, 153 and the second external electrodes 161, 162, 163 is made of one of Au, Cu, Pt, Pd, and Al and is formed to have a thickness "t" (shown in FIG. 6) of 1 to 100 µm in a sheet form using one of printing, deposition, and plating. In this case, the thickness "t" is indicative of the length in the Y-axis direction Y of the first internal electrodes 121, 131, 141 and the second internal electrodes 122, 132, 142.

A method of manufacturing the multilayer ceramic capacitor 100 according to an embodiment of the present invention is described below with reference to FIG. 15.

Figure 15:
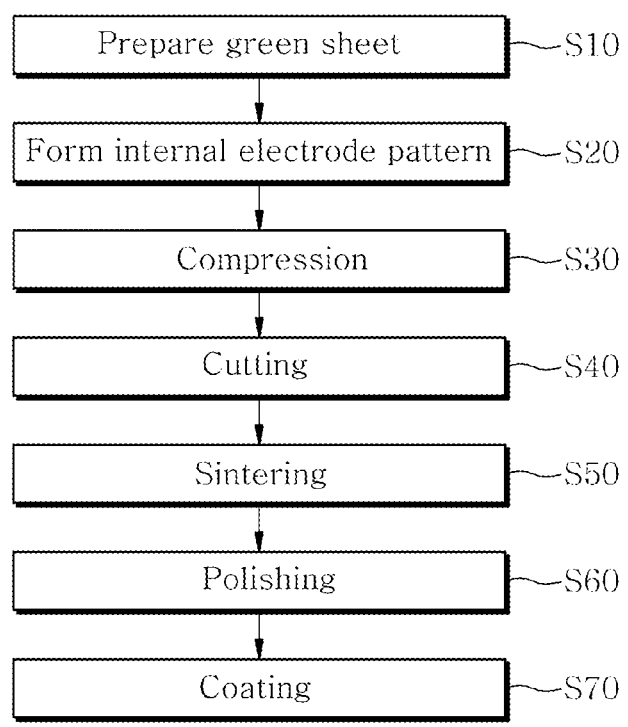
FIG. 15 is a process diagram showing a method of manufacturing the multilayer ceramic capacitor according to an embodiment of the present invention.

In the method of manufacturing the multilayer ceramic capacitor 100 according to an embodiment of the present invention, as shown in FIG. 15, first a plurality of green sheets 110c (shown in FIGS. 3, 6, and 10) is prepared at step S10. In this case, the state of the multilayer ceramic sintering body 110 prior to stacking has been shown in order to easily illustrate the internal elements of the multilayer ceramic sintering body 110 of the plurality of green sheets 110c shown in FIGS. 3, 6, and 10. The plurality of green sheets 110c shown in each of FIGS. 3, 6, and 10 has been cut. The green sheet 110c prepared at step S10 is prepared prior to cutting. The green sheet 110c is made of a known dielectric material.

When the plurality of green sheets 110c is prepared, the plurality of first internal electrodes 121, 131, 141 or the plurality of second internal electrodes 122, 132, 142 that are interconnected is formed in the top surfaces 110a of the plurality of green sheets 110c at step S20. For example, as shown in FIGS. 3 and 6, if the single internal electrode unit 120 is included in the multilayer ceramic capacitor 100, the plurality of first internal electrodes 121 or the plurality of second internal electrodes 122 is formed in the plurality of green sheets 110c. In contrast, as shown in FIGS. 8 and 10, if the two or more internal electrode units 120, 130, 140 are included in the multilayer ceramic capacitor 100, the plurality of first internal electrodes 121, 131, 141 or the plurality of second internal electrodes 122, 132, 142 is formed in the plurality of green sheets 110c.

When the plurality of first internal electrodes 121, 131, 141 or the plurality of second internal electrodes 122, 132, 142 is formed, as shown in FIGS. 3, 6, and 10, the plurality of green sheets 110c in which the plurality of first internal electrodes 121, 131, 141 or the plurality of second internal electrodes 122, 132, 142 has been formed is sequentially stacked in the vertical direction so that the first internal electrodes and the second internal electrodes are symmetrical to each other, thus forming a compression body (not shown) at step S30. When the compression body, the compression body is cut to form green chips (not shown) so that the plurality of first internal electrodes 121, 131, 141 or the plurality of second internal electrodes 122, 132, 142 is exposed to the outside at step S40. When the compression body is cut in order to form the green chips, the plurality of first internal electrodes 121, 131, 141 or the plurality of second internal electrodes 122, 132, 142 is cut so that one or more 121c, 121d, 122c, 122d, 131c, 131d, 132c, 132d, 141c, 141d, 142c, 142d of both ends 121c, 121d, 122c, 122d, 131c, 131d, 132c, 132d, 141c, 141d, 142c, 142d of one side or the other side thereof are exposed to the top surface 110a or bottom surface 110b of the green chip.

Figure 14:
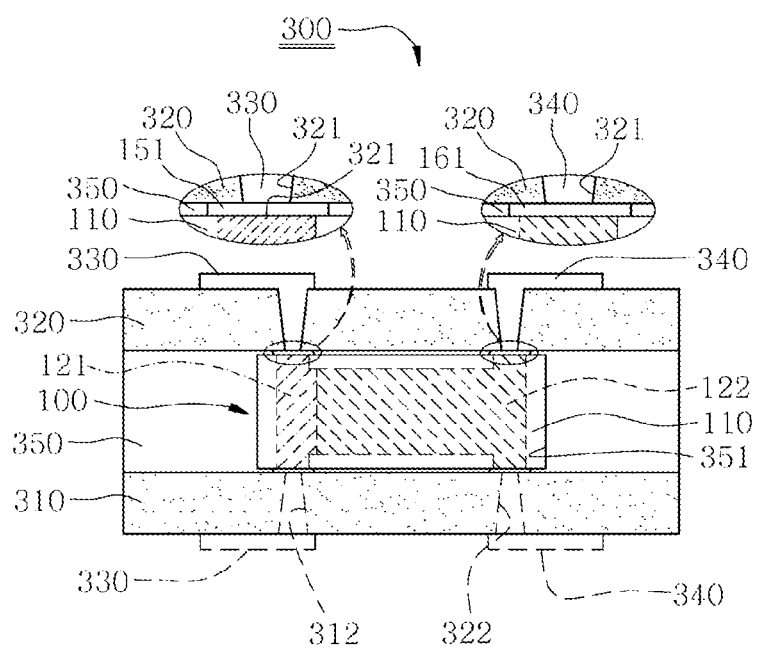
FIG. 14 is a side cross-sectional view of an embedded board using the multilayer ceramic capacitor according to an embodiment of the present invention.

When the green chip is formed by the cutting process, the multilayer ceramic sintering body 110 is formed by sintering the green chip at step S50. In this case, a known sintering technology is used, and a detailed description thereof is omitted. When the multilayer ceramic sintering body 110 is formed, a surface of the multilayer ceramic sintering body 110 is polished at step S60. The polishing is a process for removing the edges of the multilayer ceramic sintering body 110. When the polishing of the multilayer ceramic sintering body 110 is completed, the first external electrodes 151, 152, 153 or the second external electrodes 161, 162, 163 are formed by coating a metal material on one side and the other side of the top surface 110a or bottom surface 110b of the multilayer ceramic sintering body 110 at step S70. The first external electrodes 151, 152, 153 are formed on one side of the top surface 110a or bottom surface 110b of the multilayer ceramic sintering body so that they are electrically connected to the plurality of first internal electrodes 121, 131, 141. The second external electrodes 161, 162, 163 are formed on the other side of the top surface 110a or bottom surface 110b of the multilayer ceramic sintering body so that they are electrically connected to the plurality of second internal electrodes 122, 132, 142. The multilayer ceramic capacitor 100 manufactured through the aforementioned process is applied to an embedded board 300 as shown in FIG. 14.

The embedded board 300 to which the multilayer ceramic capacitor 100 has been applied includes a first insulating substrate 310, a second insulating substrate 320, the one or more multilayer ceramic capacitors 100, one or more first conductive connection pads 330, and one or more second conductive connection pads 340.

Each of the first insulating substrate 310 and the second insulating substrate 320 is made of a mixture of glass fiber and an epoxy resin which are used to fabricate a known printed circuit board. The second insulating substrate 320 is formed to be placed over the first insulating substrate 310. The first insulating substrate 310 or the second insulating substrate 320 includes one or more first laser processing holes 311, 321 into which the first conductive connection pad 330 is inserted and one or more second laser processing holes 312, 322 into which the second conductive connection pad 340 is inserted. FIG. 14 shows an embodiment in which the single multilayer ceramic capacitor 100 has been disposed and shows an embodiment in which the single first laser processing holes 311, 321 and the single second laser processing holes 312, 322 has been formed.

Each of the one or more multilayer ceramic capacitors 100 is disposed with a middle insulating substrate 350 interposed between the first insulating substrate 310 and the second insulating substrate 320. The multilayer ceramic capacitor 100 is disposed with the middle insulating substrate 350 interposed between the first insulating substrate 310 and the second insulating substrate 320. The middle insulating substrate 350 is made of prepreg. An insertion hole 351 into which the multilayer ceramic capacitor 100 will be inserted is formed in the middle insulating substrate 350. The multilayer ceramic capacitor 100 is disposed between the first insulating substrate 310 and the second insulating substrate 320 in the state in which it has been inserted into the insertion hole 351.

The one or more first conductive connection pads 330 are inserted into the first insulating substrate 310 or the second insulating substrate 320 and are connected to one side of the top surface 110a or bottom surface 110b of the multilayer ceramic capacitor 100. The one or more second conductive connection pads 340 are inserted into the first insulating substrate 310 or the second insulating substrate 320 and are connected to the other side of the top surface 110a or bottom surface 110b of the multilayer ceramic capacitor 100. FIG. 14 shows an embodiment in which the multilayer ceramic capacitor 100 having the single internal electrode unit 120 of FIG. 6 formed therein has been formed in the embedded board 300. When the multilayer ceramic capacitor 100 including the two or more internal electrode units 120, 130, 140 shown in FIGS. 7 to 9 is embedded in the embedded board 300, the first conductive connection pad 330 and the second conductive connection pad 340 are formed in the same manner as the internal electrode units 120, 130, 140. The first conductive connection pad 330 and the second conductive connection pad 340 are formed to be respectively inserted into the first laser processing holes 311, 312 and the second laser processing holes 321, 322 formed in the first insulating substrate 310 and the second insulating substrate 320 and are connected to the first external electrode 151 connected to the plurality of first internal electrodes 121 of the multilayer ceramic capacitor 100 and the second external electrode 161 connected to the plurality of second internal electrodes 122. The first internal electrodes 121, second internal electrodes 122, first external electrode 151, and second external electrode 161 of the multilayer ceramic capacitor 100 have the same configurations or embodiments as those described above, and a detailed description thereof is omitted.

A ball grid may be applied to each of the one or more first conductive connection pads 330 and the one or more second conductive connection pads 340 indicated by dotted lines in FIG. 14. The first external electrodes 151 and the second external electrodes 161 formed in the multilayer ceramic capacitor 100 can be formed to have a uniform thickness because they are formed in the top surface 110a or bottom surface 110b of the multilayer ceramic sintering body 110. Accordingly, the first laser processing holes 311, 321 or the second laser processing holes 312, 322 can be easily formed in the first insulating substrate 310 and the second insulating substrate 320 using a laser without damage to the first external electrodes 151 and the second external electrodes 161.

When the embedded board 300 is applied to an embedded printed circuit board, the lead (not shown) of an electronic part (not shown) is mounted on the first conductive connection pad 330 and one or more second conductive connection pads 340 of the embedded board 300. The first conductive connection pad 330 or the second conductive connection pads 340 may be formed in the form of a ball grid which is used to manufacture an electronic part module (not shown) in addition to a pad form.

As described above, in the multilayer ceramic capacitor, the embedded board using the multilayer ceramic capacitor, and the method of manufacturing the same according to the embodiments of the present invention, the internal electrodes are formed to be exposed to the top or bottom surface of the multilayer ceramic sintering body, and the multilayer ceramic capacitor is mounted on the printed circuit board so that the plurality of internal electrodes is electrically connected. Accordingly, the productivity of the multilayer ceramic capacitor can be improved or the prime cost of the multilayer ceramic capacitor can be reduced. Furthermore, the multilayer ceramic capacitor having varying capacitance can be mounted on the printed circuit board because the internal electrodes formed to be exposed to the top or bottom surface of the multilayer ceramic sintering body have different areas.

Furthermore, in the multilayer ceramic capacitor, the embedded board using the multilayer ceramic capacitor, and the method of manufacturing the same according to the embodiments of the present invention, the external electrodes are formed in the internal electrodes exposed to the top or bottom surface of the multilayer ceramic sintering body. Accordingly, an adhesive force between the multilayer ceramic capacitor and the printed circuit board can be improved when the multilayer ceramic capacitor is mounted on the printed circuit board. Furthermore, the embedded board having the multilayer ceramic capacitor embedded therein can be easily manufactured because the internal electrodes are formed to be exposed to the top or bottom surface of the multilayer ceramic sintering body.

Although few exemplary embodiments of the present invention have been shown and described, the present invention is not limited to the aforementioned exemplary embodiments. Those skilled in the art will appreciate that the present invention may be modified in various ways without departing from the principle and spirit of the invention, and the scope of the present invention is defined by the claims and their equivalents.

What is claimed is:

1. A multilayer ceramic capacitor, comprising:
a multilayer ceramic sintering body; and
a first internal electrode unit, a second internal electrode unit and a third internal electrode unit formed to be vertically placed inside the multilayer ceramic sintering body,
wherein the first internal electrode unit, the second internal electrode unit and the third internal electrode unit are formed in such a way as to be spaced apart from each other and sequentially stacked, the first internal electrode unit has a first area, the second internal electrode unit has a second area smaller than the first area, and the third internal electrode unit has a third area smaller than the second area,
wherein each of the first internal electrode unit, the second internal electrode unit and the third internal electrode unit comprises:
a first internal electrode having a sheet form, one end of a first side of the first internal electrode being formed to be exposed to a top surface of the multilayer ceramic sintering body, the other end of the first side thereof being formed to be exposed to a bottom surface of the multilayer ceramic sintering body, and the top surface being vertically opposite to the bottom surface, and a second internal electrode having a sheet form, one end of a second side of the second internal electrode being formed to be exposed to the top surface of the multilayer ceramic sintering body, and the other end of the second side thereof being formed to be exposed to the bottom surface of the multilayer ceramic sintering body, the second side being opposite to the first side.

2. The multilayer ceramic capacitor of claim 1, wherein the bottom surface faces a surface of a printed circuit board on which the multilayer ceramic sintering body is mounted.

3. The multilayer ceramic capacitor of claim 1, wherein the first internal electrodes are spaced apart from each other at an interval of 0.3 to 5 µm and the second internal electrodes are spaced apart from each other at an interval of 0.3 to 5 µm.

4. The multilayer ceramic capacitor of claim 1, wherein the first internal electrodes and the second internal electrodes comprise:
   internal electrode pattern layers formed in such a way as to be spaced apart from each other; and
   exposure electrode pattern layers connected to the internal electrode pattern layers, both ends of each of the exposure electrode pattern layers being exposed to the top and bottom surfaces, respectively, of the multilayer ceramic sintering body,
   wherein the internal electrode pattern layers and the exposure electrode pattern layers are formed of Cu or Ni.

5. The multilayer ceramic capacitor of claim 4, wherein the exposure electrode pattern layers have a width of 30 to 50 µm and a height higher than that of the internal electrode pattern layers.

6. The multilayer ceramic capacitor of claim 1, wherein:
   the first internal electrodes and the second internal electrodes are connected by first external electrodes, respectively,
   the second internal electrodes are connected to second external electrodes, respectively,
   the first external electrodes are formed in the top or bottom surface of the multilayer ceramic sintering body and are electrically connected to the first internal electrodes, and
   the second external electrodes are formed in the top or bottom surface of the multilayer ceramic sintering body and are electrically connected to the second internal electrodes.

7. The multilayer ceramic capacitor of claim 6, wherein the first external electrodes and the second external electrodes are made of one of Au, Cu, Pt, Pd, and Al, and is formed in a thickness of 1 to 100 µm in a sheet form.

* * * * *